(12) United States Patent
Wenz et al.

(10) Patent No.: US 12,209,302 B2
(45) Date of Patent: Jan. 28, 2025

(54) VACUUM SYSTEM AND METHOD TO DEPOSIT A COMPOUND LAYER

(71) Applicant: EVATEC AG, Trübbach (CH)

(72) Inventors: Kai Wenz, Sargans (CH); Boris Trajcevski, Sax (CH); Philip Zeller, Sargans (CH); Martin Kratzer, Feldkirch (AT)

(73) Assignee: EVATEC AG, Trübbach (CH)

( * ) Notice: Subject to any disclaimer, the term of this patent is extended or adjusted under 35 U.S.C. 154(b) by 266 days.

(21) Appl. No.: 17/414,446

(22) PCT Filed: Oct. 28, 2019

(86) PCT No.: PCT/EP2019/079314
§ 371 (c)(1),
(2) Date: Jun. 16, 2021

(87) PCT Pub. No.: WO2020/126175
PCT Pub. Date: Jun. 25, 2020

(65) Prior Publication Data
US 2022/0098724 A1 Mar. 31, 2022

(30) Foreign Application Priority Data

Dec. 19, 2018 (CH) .................................... 01563/18

(51) Int. Cl.
*C23C 14/00* (2006.01)
*C23C 14/06* (2006.01)
(Continued)

(52) U.S. Cl.
CPC ...... *C23C 14/0063* (2013.01); *C23C 14/0617* (2013.01); *C23C 14/3407* (2013.01);
(Continued)

(58) Field of Classification Search
CPC .............. H01J 37/3408; H01J 37/3429; H01J 37/3441; H01J 37/3411; H01J 37/3488;
(Continued)

(56) References Cited

U.S. PATENT DOCUMENTS 5,796,074 A * 8/1998 Edelstein ............ C23C 16/4586
219/390
6,296,747 B1 * 10/2001 Tanaka .................. C23C 14/345
204/298.14
(Continued)

FOREIGN PATENT DOCUMENTS

CN 102439697 A 5/2012
CN 107636195 A 1/2018
(Continued)

OTHER PUBLICATIONS

International Search Report for PCT/EP2019/079314 dated Jan. 29, 2020.
Written Opinion for PCT/EP2019/079314 dated Jan. 29, 2020.

*Primary Examiner* — Michael A Band
(74) *Attorney, Agent, or Firm* — McDonald Hopkins LLC

(57) ABSTRACT

A vacuum apparatus to deposit a compound layer on at least one plate shaped substrate by sputtering. The apparatus including a vacuum chamber with side walls around a central axis. The chamber includes at least one inlet for a process gas, at least one inlet for an inert gas, a substrate handling opening, a pedestal including an electrostatic chuck formed as a substrate support in a central lower area of a sputter compartment, a magnetron sputter source including the target at the frontside and a magnet-system at the backside of the source, an anode looping around the target and at least an upper part of the pedestal and a pump compartment connected to a bottom of the sputter compart- (Continued)

Figure 1:
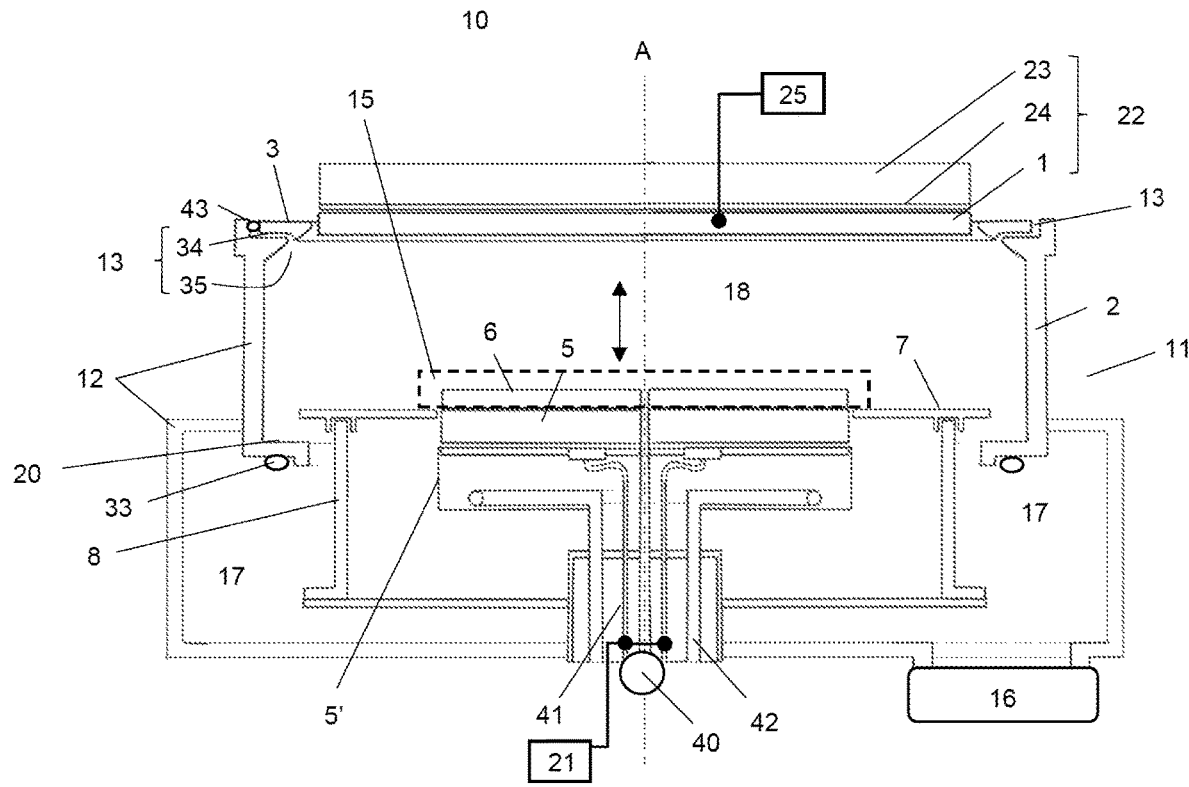

ment by a flow labyrinth. A vacuum pump system is connected to the pump compartment.

26 Claims, 5 Drawing Sheets

(51) Int. Cl.
    *C23C 14/34*     (2006.01)
    *C23C 14/35*     (2006.01)
    *C23C 14/50*     (2006.01)
    *C23C 14/56*     (2006.01)
    *H01J 37/34*     (2006.01)

(52) U.S. Cl.
    CPC ............ *C23C 14/354* (2013.01); *C23C 14/50* (2013.01); *C23C 14/56* (2013.01); *H01J 37/3411* (2013.01); *H01J 37/3429* (2013.01); *H01J 37/3441* (2013.01); *H01J 37/3488* (2013.01); *H01J 37/3408* (2013.01)

(58) Field of Classification Search
    CPC .............. H01J 37/32834; C23C 14/56; C23C 14/3407; C23C 14/354; C23C 14/50; C23C 14/0063
    See application file for complete search history.

(56) References Cited

U.S. PATENT DOCUMENTS

| | | | |
|---|---|---|---|
| 9,322,092 B2* | 4/2016 | Yamaguchi | H01J 37/3417 |
| 9,779,921 B2 | 10/2017 | Shimane et al. | |
| 10,763,090 B2 | 9/2020 | Allen et al. | |
| 11,049,701 B2* | 6/2021 | Allen | C23C 14/351 |
| 2010/0206718 A1 | 8/2010 | Li et al. | |
| 2013/0255576 A1 | 10/2013 | Rasheed et al. | |
| 2014/0003891 A1 | 1/2014 | Kobayashi et al. | |
| 2015/0294845 A1 | 10/2015 | Shimane et al. | |
| 2016/0369390 A1 | 12/2016 | Bartzsch et al. | |
| 2018/0151325 A1 | 5/2018 | Allen et al. | |
| 2018/0211818 A1 | 7/2018 | Kubota et al. | |

FOREIGN PATENT DOCUMENTS

| | | |
|---|---|---|
| DE | 4304581 A1 | 8/1994 |
| DE | 102013213935 A1 | 1/2015 |
| EP | 0612097 A1 | 8/1994 |
| JP | 2004018885 A | 1/2004 |
| JP | 2010001505 A | 1/2010 |
| JP | 2013501855 A | 1/2013 |
| JP | 2017534750 A | 11/2017 |
| WO | 2011019566 A2 | 2/2011 |
| WO | 2016028640 A1 | 2/2016 |
| WO | 2016192814 A1 | 12/2016 |

* cited by examiner

VACUUM SYSTEM AND METHOD TO DEPOSIT A COMPOUND LAYER

The application refers to a vacuum apparatus for sputter deposition of a compound layer, a multi-chamber system (MCS), and a method to produce an as coated essentially two-dimensional flat substrate.

TECHNICAL BACKGROUND

As miniaturization of piezoelectrical devices like microphones, electrical frequency filters, ultrasound generators, sensors and actuators is still ongoing, material properties of piezoelectric materials, especially of piezoelectric layers and coating become more and more important. Such properties are a uniform and highly oriented microstructure, shown by the θ/2θ X-rays diffraction pattern and expressed in narrow FWHM value of the rocking curve as well as low dielectric loss properties expressed by low tan δ values and the like. It is well known that Piezoelectric response can be improved by alloying piezoelectric AlN films with other metals, whereby the hexagonal structure of AlN is still preserved. The most promising material for industrial use is Sc up to a Sc concentration of 43 at %. Other known materials are Cr and MgHf. However, it has been found that the quality of such coatings in mass production depends on a very tight reproducibility of layer parameters which are directly linked to respective apparatus and system requirements as well as to tight process control. Despite of many efforts and progress with state of the art vacuum equipment there could not be established adequate technical provisions up to now to address all issues necessary to meet the fast growing demand for higher precision and performance needed to produce coatings for such devices.

SUMMARY OF THE INVENTION

It is an aim of the present invention to provide an apparatus and a multi-chamber system (MCS) to enable the deposition of piezoelectric layers and coatings as well as the production of respectively coated substrates, like wafers, whereby a better process control is provided. Such a process control may comprise a better vacuum regime in terms of minimized pressure fluctuation during the deposition of the piezoelectric layer as well as any measures to improve stress control within the piezoelectric layer as discussed in detail below. With reference to the piezoelectric layer material as mentioned with the Technical Background it should be mentioned that the present invention is directed to the improvement of any such state of the art materials, irrespective of the fact that examples and embodiments of the present invention may be discussed at the hand of certain materials due to reasons of practicability.

An inventive vacuum apparatus can be used for layers of very different types but has some design features which improves process stability and reproducibility essentially when depositing a compound layer on at least one plate shaped substrate by sputtering. Such features comprise:

a vacuum chamber with side walls around a central axis (A), the chamber including
  at least one inlet for a process gas;
  at least one inlet for an inert gas;
  a substrate handling opening;
  a pedestal comprising an electrostatic chuck formed as a substrate support in a central lower area of a sputter compartment, the pedestal being mounted in an electrically isolated manner and connected, e.g. by a switch controlled by the system control unit of the apparatus, to a first pole of a first voltage source, whereby together with an electrostatic chuck (ESC) a bias electrode is constituted; the pedestal is movable in a vertical direction towards and away from a target, from an upper processing position to a lower processing position and vice-versa when a sputter process is active, which makes it possible to control film-stress on the substrate (s) over target life time and compensate advancing target erosion;

a magnetron sputter source comprising the, e.g. metallic or alloy target at the frontside towards the sputter compartment and a magnet-system at the backside of the source, which can be additionally equipped with a cooled back-plate and/or a, e.g. water cooled flange between the target material and the magnet system; the target is mounted in a central area in a top region of the sputter compartment of the chamber in an electrically isolated manner and is connected, e.g. by a further electrical switch controlled by the system control unit of the apparatus, to a first pole of a second voltage source, thereby forming the sputtered surface of the sputter electrode;

an essentially cylindrical anode looping around the target and at least an upper part of the pedestal which comprises the substrate support and the ESC thereby forming the sidewalls of the sputter compartment, the anode being electrically connected to ground;

a pump compartment being connected to a bottom of the sputter compartment by a flow labyrinth to prevent a so called "plasma spill out" from the sputter compartment into the pump compartment, whereby plasma enters the pump compartment with well known drawbacks like process-instabilities, parasitic loss of plasma power and potential damage to the pumping installation; the flow labyrinth being designed to provide essentially the same flow conductance in the upper and lower position of the pedestal and in any position in between;

a vacuum pump system (16) connected to the pump compartment (17).

Movement of the pedestal during a running sputter process can be performed by step motors or other positioning means controlled by the system control unit as known by man of the art.

One design to realize such characteristics of the flow labyrinth can be to provide a flow labyrinth which has the same flow area during a movement from the upper to the lower position. In a further embodiment the flow labyrinth may comprise at least one annular pump channel looping around the pedestal in an area below the substrate support and the ESC. Thereby at least one characteristic distance (wen) between at least two cylindrically or/and ring-shaped surrounding walls of the pump channel can be kept constant in the upper and lower processing position of the pedestal and in any position in between. Such features of the labyrinth can be combined with all embodiments of the invention.

In a further modification the apparatus may have an electrically isolated target ring which is mounted looping around the circumference of the target between the target and the anode. The target ring can be made of a conductive material, e.g. a metal, an alloy or carbon, and is isolated from ground and target potential by at least one isolator which is hidden from any line of sight towards the sputter compartment, e.g. by the anode and/or the target shield. At the same time dark space distances between respective neighboring conductive components, like target and target ring and target ring and anode are observed, which can be between about 2 to 10 mm for typical process pressures between 0.1 to 13.3 Pa (1-100 mTorr) used for sputter processes. Thereby formation of a floating potential on the target ring can be assured during the sputter process for a long time without the need to change the isolator due to formation of conductive surface areas. The at least one, e.g. at least in part ring-like, isolator may be positioned on the anode or in a channel structure of the anode and can comprise ceramic material like alumina, boronnitride or the like.

In a further embodiment a ring-shaped ring-shield, which is mounted electrically isolated onto the pedestal and surrounds the substrate support, a mounted wafer on the support and facultatively the ESC. The ring-shield of the inventive apparatus may be connected to a third voltage source to adjust the voltage according to the process needs, which can be used as a further variable to influence film stress of sputtered layers.

The ESCs surface and/or the pedestals surface may comprise an open structure of some micrometer or even sub-micrometers depth which is connected to at least one respective back-gas inlet. When both surfaces comprise an open structure connected with a back-gas inlet a heat transmitting inert gas like Ar can be applied between the ESC surface and a mounted substrate to control the substrate temperature as well as between the pedestals surface and the ESC to control the ESC temperature. Thereby both at least one back-gas inlets can be connected to one common or, when different back gas pressures should be used to respective separate feedthroughs. Whereby a common or respective separate gas supplies for cooling/heating gas(es) are connected to the common or separate feedthrough to control the substrates and/or the pedestals temperature. Open structures can be so called mensa-structures with a number of, e.g. table like, support points evenly spread on the respective surface or, e.g. cob-web or labyrinth like, channel-structures in the surface(s) of the ESC and/or the pedestal. Both structures can be applied to the surface e.g. by laser-structuring of the surface. With separate pressure supplies and feedthroughs, the back-gas pressure between pedestal and ESC can be chosen higher whereby faster heat exchange can take place.

To deposit piezoelectric compounds the target may comprise at least one metallic element like Al to deposit AlN or at least two metallic elements like Al and Sc to deposit AlScN, Al and Cr to deposit AlCrN or Al, Mg and Hf to deposit AlMgHfN. The process gas will comprise Nitrogen as a reactive gas. The target may be an alloy target or a powder metallurgically pore-tightly sintered target. Pore-tightly sintered means a target of a density which is near the theoretical density, which can be achieved e.g. by spark plasma sintering.

The anode can be manufactured as a single piece anode to enable an even heat flow in the anode. Additionally, a heating/cooling circuit connected to a heating/cooling unit can be foreseen with the anode to temper the anode during pump or idle time and to cool the anode during the sputter process. Furthermore, gas supply means can be mounted along or around an upper or a lower circumference of the anode. Such gas supply means may comprise at least one of a gas-ring with distribution openings allocated along its inner, outer, upper or lower circumference and a channel structure integrated in the anode with a circular distribution gap or respectively allocated inlet openings and/or or further inlet channels. The channel structure can be foreseen near the top of the anode round the target, whereby the channel may be formed in the anode itself or between the anode and the floating target ring which may sit in the channel.

The first voltage source can be a first RF power supply which can be driven between 2-30 MHz, whereby for many cases a 13.56 MHz supply will be sufficient.

The second voltage source can be a pulsed DC power supply, or a DC power supply combined with a second RF power supply. When the DC power supply is combined with a second RF power supply at least the DC power supply is connected by an adapter network, e.g. a low-pass filter to the sputter electrode to protect it against harmful incoming RF. To adjust a phase relation between the first RF source and the pulsed DC power supply or the second RF source the apparatus may comprise adjusting means. These can be realized by an adjusting unit integrated into the system control unit (SPU) or as a sub-control-unit connected to the SPU. Thereby in-phase mode or defined out of phase modes can be adjusted according to the process needs. The pulsed DC power supply may be driven in a frequency range from 50 to 400 kHz wit a duty cycle from 50 to 90% and a power of 7 to 14 kW.

Furthermore, the apparatus may comprise control means to control a flow of the reactive gas in dependency of at least one of the following process parameters: a target voltage, a characteristic parameter of the plasma emission from the actively sputtered surface of the target, a gas composition. The characteristic parameter of the plasma emission may be the intensity of a characteristic emission line or a characteristic line pattern measured e.g. by a plasma emission monitor (PEM). The gas composition may be measured by a process gas analyzing system like an RGA.

To avoid parasitic plasmas round at least one of the ESC, the pedestal and RF-powered parts of the pedestals base, a dark space shield connected to ground can be provided in dark space distance, see above, looping around at least a base of the pedestal. Such a dark space shield may form one sidewall of the pump channel and can be moved with the pedestal. The second, with reference to the central axis A, outer sidewall forming such an annular pump-channel can be formed by a second channel shield mounted to and movable with the dark space shield or alternatively being mounted to or being part of the stationary anode.

Additionally, at least one of a pedestal temperature and a substrate temperature measurement device should be provided to control, e.g. the pedestals temperature with an electric temperature measurement device and/or the substrate temperature with an optic measurement device, like a pyrometer at the back-side surface of the substrate. Such temperature measurement devices are used to control the substrate temperature, e.g. via the SPU and a heating and cooling unit connected with a respective heating and cooling fluid circuit below the support surface of the pedestal and/or the ESC. It should be mentioned that one heating and cooling unit to supply the pedestal, the anode and the magnetron sputter source to temper or cool the backplate or the target flange may be sufficient for standard processes. For processes which need a tighter temperature control however a separate heating and cooling unit for the pedestal and a separate cooling/tempering unit for the magnetron source and the anode would be suited better. Whereby tight temperature control of the pedestal and therefor of the substrate has proven to be one key to produce highly textured compound layers. For high deposition temperatures, e.g. above 100° C. a resistance heater plate can be integrated in addition or instead of the heating and cooling unit in or the surface of the pedestal.

In a further modification the target consists of at least one of the following materials or a mixture thereof:

aluminium which stands for Al or AlMe, aluminium-scandium which stands for AlSc or AlScMe,
aluminium-chromium which stands for AlCr or AlCrMe,
magnesium-hafnium which stands for MgHf or MgHfMe,
whereas Me stands for at least one further, e.g. minor, metal in a concentration of 0.1 to 10 atomic percent with reference to the overall metal content of the respective layer and a mixture of two main metals as AlSc, AlCr or MgHf always comprises at least 1% of the main metal which is in lower concentration, which is irrespective of the presence of any further minor metal Me.

The invention also refers to a multi-chamber vacuum system (MCS) to process at least one plate shaped substrate, comprising at least one load-lock chamber, transfer means, and at least three processing modules, whereby a first processing module can be a PVE module (P1) configured to etch a surface of a substrate, a second processing module can be a metal sputter module (P2) configured to deposit a metal layer by sputtering to the surface of the substrate, and a third processing module can be a compound sputter module (P4) configured according to the apparatus of the forgoing claims.

The MCS system may also comprise a fourth process module which can be an annealing module (P3) configured to heat a substrate to an annealing temperature $T_A$ between 550° C. and 900° C. and may be configured to heat the substrate within 60 to 180 s to the annealing temperature $T_A$.

In a further embodiment the MCS system may also comprise at least one further of at least one of a PVE module (P1'), a metal sputter module (P2'), and a compound sputter module (P4').

With any of such MCS embodiments at least one load lock chamber and process modules (P1, . . . P4') can be arranged in a circular or polygonal way round a central handler chamber. In an alternative embodiment load lock chambers and process modules (P1, . . . P4') can be arranged in a linear way and the handler can be a linear handler, e.g. at least one transport belt or transport chain.

With such MCS embodiments at least one of a preprocessing and a postprocessing module ($pp_{12}$, $pp_{34}$, $pp_{56}$) may be operatively connected with at least one of the load lock chambers.

The invention also comprises a method to produce a coated essentially two-dimensional flat substrate, e.g. a wafer, by a sputter process whereby an aluminum containing target is sputtered in an apparatus as discussed above. Thereby a piezoelectric response can be improved by alloying piezoelectric AlN films with at least one minor metal $Me_m$, whereby the hexagonal structure of AlN is still preserved. $Me_f$ may be at least one of Sc, Cr, Mg or Hf which can be alloyed to the sputtered aluminum target. Such a method may comprise the deposition of at least one piezoelectric layer. The layer may consist of at least one of the following materials or a mixture thereof:

aluminium nitride (AlN, AlMeN),
aluminium-scandium nitride (AlScN, AlScMeN),
aluminium-chromium nitride (AlCrN) or
magnesium-hafnium nitride (MgHfN, MgHfMeN), whereas Me stands for at least one, e.g. minor, metal in a concentration of 0.1 to 10 atomic percent with reference to the overall metal content of the respective layer.

The first voltage source, which is connected to the bias electrode, can be a first RF-source driven at a frequency from 2 to 30 MHz using a very moderate bias power from 0 to 100 W or even lower from 0 to 30 W to avoid disturbing the growth of the respective piezoelectric layer. Whereas the second voltage source, which is connected to the target electrode, can be a pulsed DC-source driven at a pulse-frequency from 50 to 400 kHz, with a power from 7 to 14 kW. Furthermore, a positive voltage may be applied during the off-period. Alternatively, the second voltage source may comprise a DC-source and a second RF-source connected by an adapter network to each other and the target electrode, whereby the second RF-source may be driven at a pulse-frequency from 0.9 to 30 MHz.

To optimize certain features of the layer, which can be to minimize and/or equalize stress and/or stress distribution of the sputter deposited layers, respectively of the coating over the wafer surface as far as possible, at least one of the following process parameters may be alternated stepwise or continuously, e.g. over a series of processes in dependency of subsequent thickness or stress measurements and/or during the process by in-situ process control, e.g. in dependency of optical film thickness measurement or respective in-situ stress measurement:

a power of the first voltage source,
a power of the second voltage source,
a duty cycle of the pulsed DC-source,
a quotient of the power of the DC-source and the second RF-source,
a distance between a substrate surface and a target surface which could be also effectively used to balance the influence of target erosion over several process cycles,
a defined (DC, RF) voltage applied to the isolated ring-shield,
a high deposition temperature of the piezoelectric layer
an annealing step to anneal at least a seed and/or a bottom layer.

Further only exemplarily mentioned layer or coating features can be adjusted by above mentioned process parameters as for instance the rocking curve of a wafer, which can be measured with diffraction topography methods like plane wave topography, especially respective sequential topography along a rocking curve. A good approximation which can be used instead is the determination of the full width half maximum (FWHM) of certain characteristic crystal lines of respective measured x-ray diffractograms.

The same refers to the surface roughness contribution of the coated layer and the dielectric loss which quantifies the layers inherent dissipation of electromagnetic energy and can be given as loss angel δ or corresponding loss tan δ. Examples are given below.

EXAMPLES AND FIGURES

The invention shall now be further exemplified with the help of examples and figures. The figures are all drawn merely schematically and simplified, same reference numbers refer to features of the same or similar functionality. With reference to the terms top or bottom as with up, on, below and above or left and right it should be mentioned that such terms are used for ease of use or with reference to the figures only and not in a restricting way, so that a top and bottom configuration with wafer and target in an opposing horizontal position as present could be also applied e.g. to a left and right configuration or vice versa, if the same inventive concept should be applied to another apparatus type having both targets and substrate in a vertical or inclined position. The same refers to cylindrically and ring-like structures which result from the respective design of the examples as shown which could be transferred also to other chamber symmetries, e.g. (rect)angular geometries.

Figure 2:
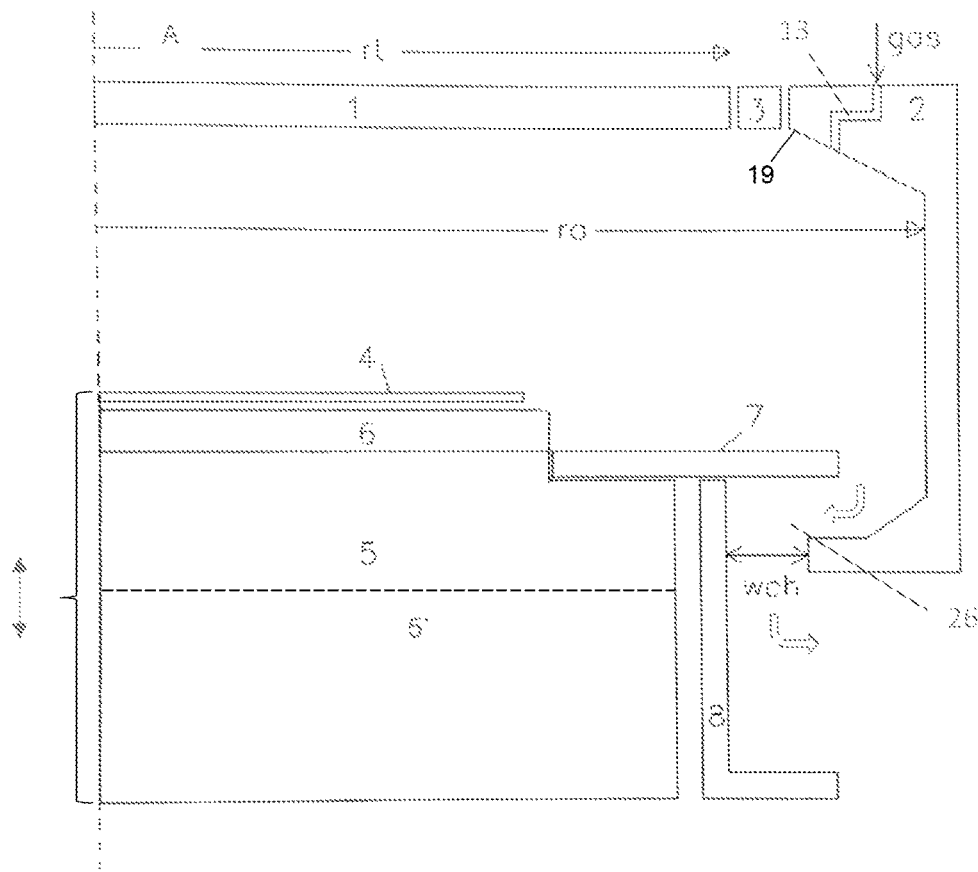
Figure 3:
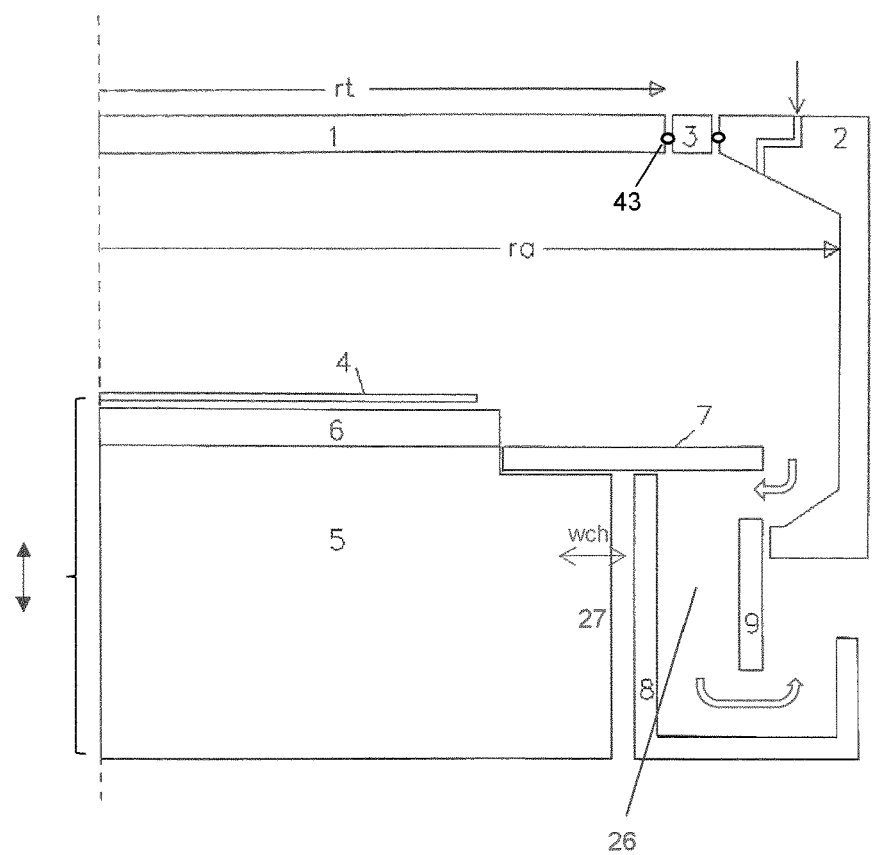
Figure 4:
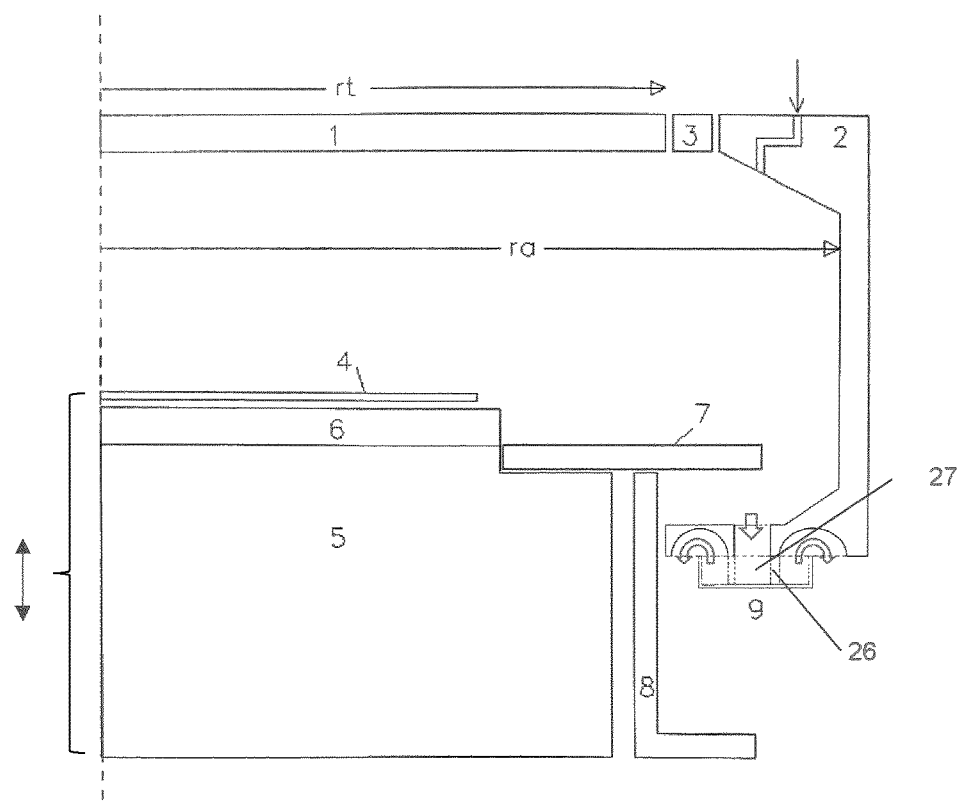
Figure 5:
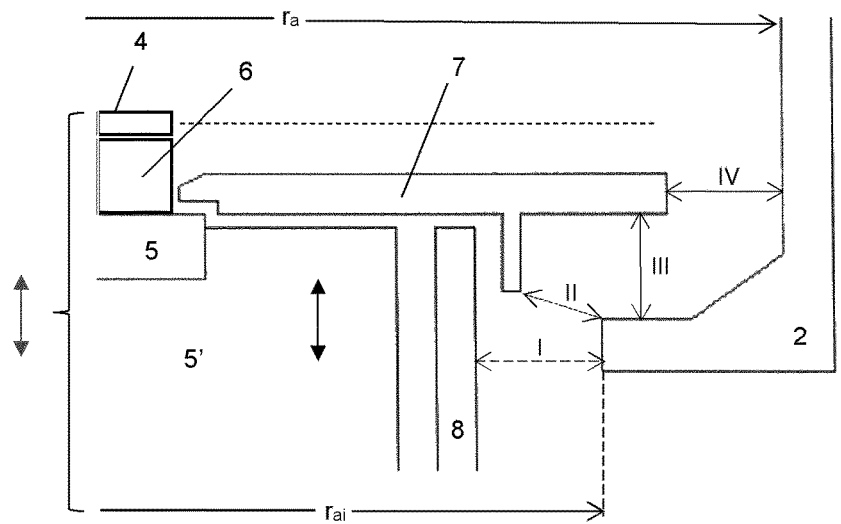
Figure 6:
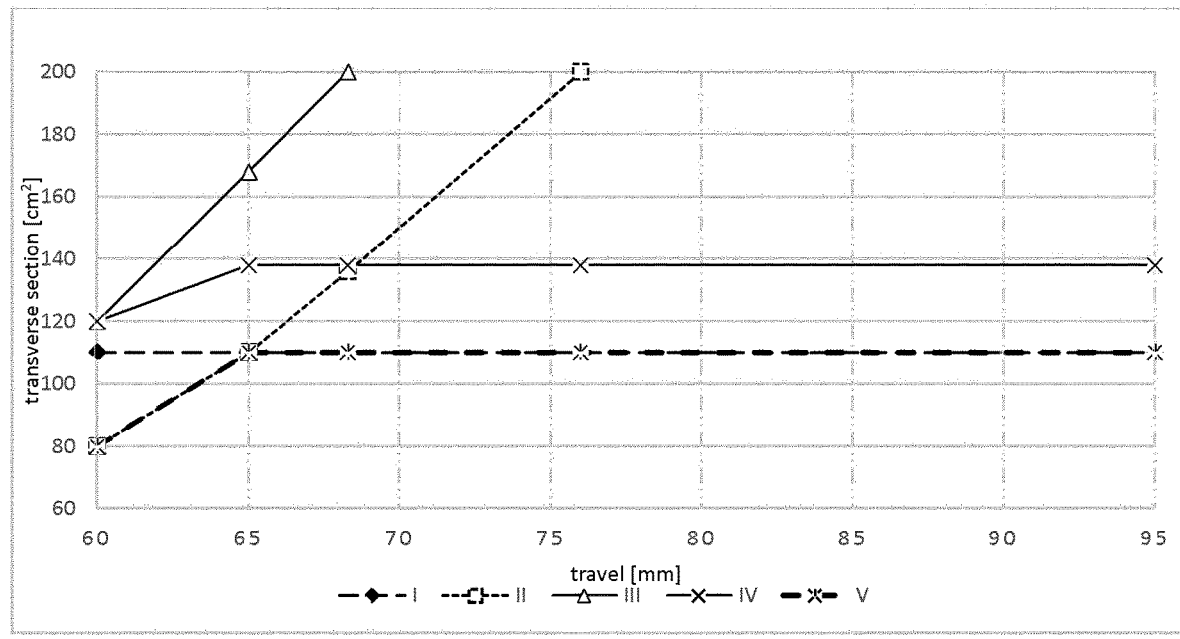
Figure 7:
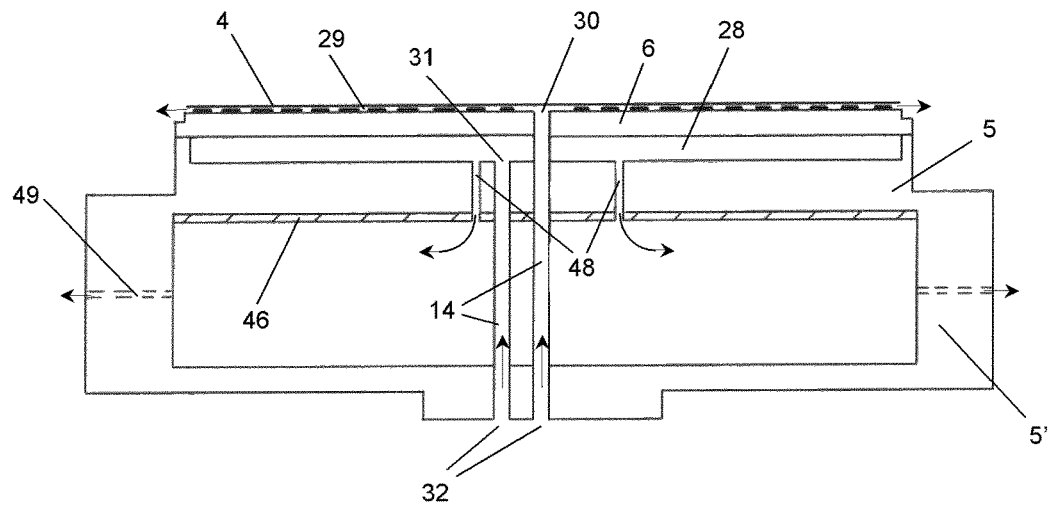
Figure 8:
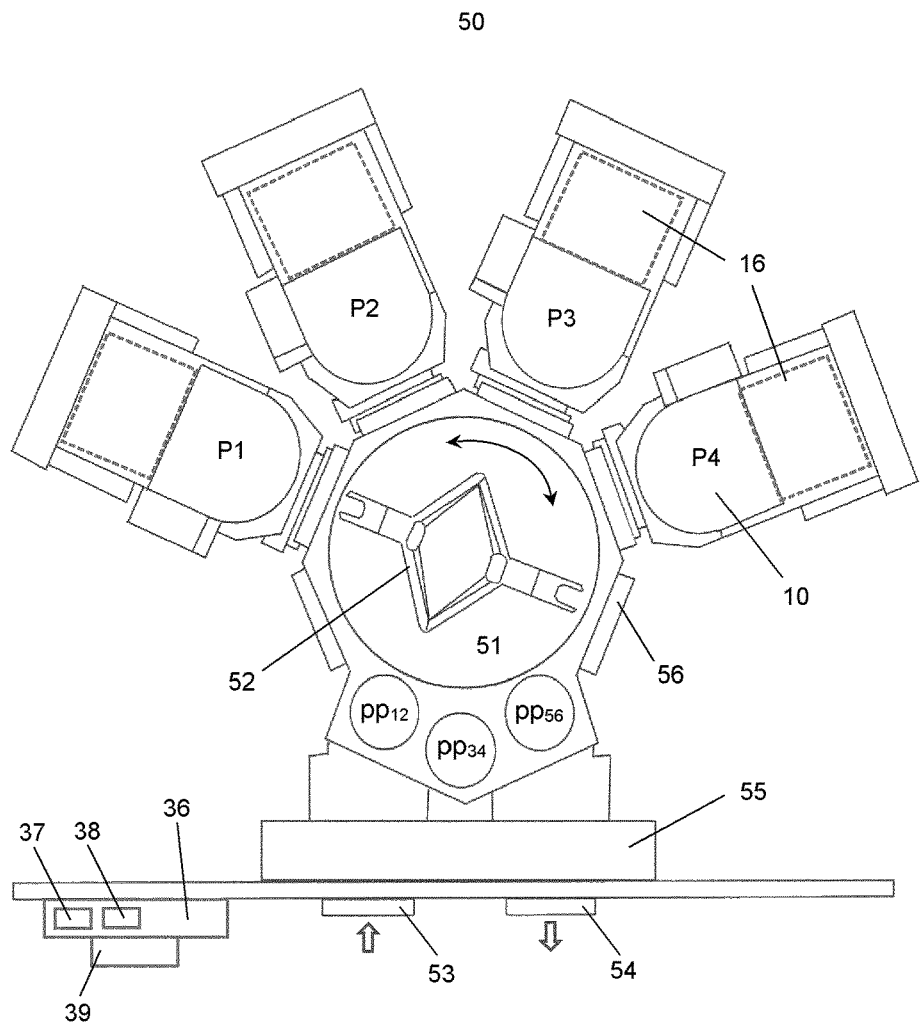
Figure 9:
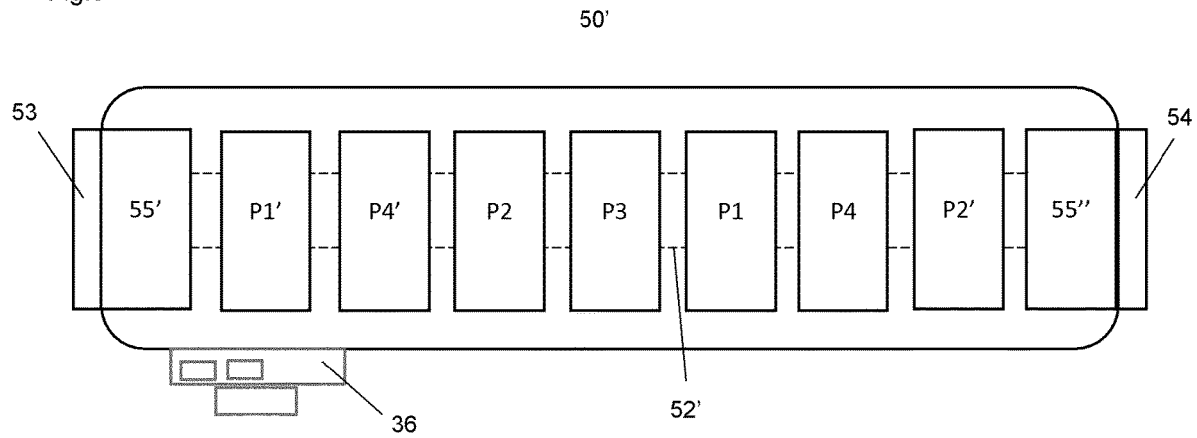

The figures show:

FIG. 1: An embodiment of an apparatus according to the invention;

FIG. 2: An embodiment of a flow labyrinth;

FIG. 3: A further embodiment of a flow labyrinth;
FIG. 4: A further embodiment of a flow labyrinth;
FIG. 5: Details of a flow labyrinth;
FIG. 6: A flow diagram;
FIG. 7: A pedestal with double cool/heat gas supply;
FIG. 8: A circularly arranged inventive MCS;
FIG. 9: A linearly arranged inventive MCS.

FIG. 1 shows an outline of an inventive sputter apparatus comprising a two-part vacuum chamber 10, split into a sputter compartment 18 and a pump compartment 17, both in terms of gas flow connected by a flow labyrinth 26. In this this embodiment the apparatus has an essentially cylindrical setup, round an apparatus axis A. Target diameter $r_t$ and inner diameter $r_a$ of the anode 2 which forms the sidewalls of the sputter compartment 17 can be chosen according to the substrate, for instance according to a wafer size. For a 200 mm wafer a target diameter $r_t$ can be chosen from 250 to 400 mm and an inner diameter $r_a$ from 300 to 450 mm. The sidewalls 11 are designed as a cathode 2 of the magnetron sputter source 22, on the top of the sputter compartment 18, which comprises the target 1 and the magnet system 23. Further on a target backplate 24 may be provided in case of expensive or mechanically week target material. Between the target 1 and the cathode 2 an isolated mounted however conductive target ring 3 is positioned on a ceramic isolator 43 in form of a ring or ceramic supports arranged in an upper circumference of the anode 2 around the target 3. The target ring 3 is on floating potential. The isolator 43 sits hidden against any line of sight towards the sputter compartment 17 within a channel structure 34 which together with the inlet gap 35, gives the inlet 13 for the process gas which can be a reactive gas, a mixture of different reactive gases with or without addition of a diluent inert gas. In the embodiment as shown in FIG. 1 the inlet gap 35 is formed between the anode and the target ring 3. An alternative or additional inlet for process gas can be provided in form of a gas ring 33 near a lower circumference of the anode. Thereby process gas and inert gas supply can be split, which can as an example help to prevent target poisoning when process gas is supplied only via the remote gas ring 33, which can be positioned in the pump compartment 17 as shown, and only inert sputter gas is provided to the upper inlet 13.

In the bottom of the sputter compartment 18 a vertically movable RF-pedestal, see reference number 5 and vertical double arrow, is mounted comprising a electrostatic chuck 6 to fix the wafer 4 and the pedestal base 5'. Together with the pedestal a ring-shield 7 and a dark space shield 8 can be moved up and down. Both ring-shield 7 and dark space shield 8 are electrically isolated against the RF-potential of the pedestal and/or in dark space distance to respective RF-supporting parts of the pedestal 5 and the pedestals base 5'. However, the dark space shield 8 is on ground potential, whereas the ring-shield 7 is on floating potential or provided with a separate voltage source to form a third electrode in the sputter compartment 18. Such a third electrode 7 surrounding the wafer circumference can be used in addition to other known measurements, like e.g. target power and substrate bias, to optimize stress and stress distribution within the layers of a piezoelectric active coating. Via respective feedthroughs 32, the pedestal is connected to RF-lines 41 and fluid lines 42 for heating and cooling of pedestal 5 and ESC 6. An optical temperature measurement device 40, e.g. a pyrometer is used to control the temperature at the backside of the wafer 4, which needs an additional optical feedthrough 32. At the bottom or a sidewall 11 of the pumping compartment 17 a pump socket is provided to connect to the high vacuum pump system 16.

FIG. 2 to 5 show different modifications of the flow labyrinth 26. All parts connected to the pedestal 5 or it's base 5', like electrically isolated ring-shield 7 and dark space shield 8 move together with the pedestal, whereas anode 2 and channel shield 9 are stationary. For reasons of process stability it is important to keep pressure fluctuations as low as possible. Therefor it is important to have the same pumping speed provided at every process relevant position of the pedestal, which does not necessarily include a potential loading and deloading position, e.g. the lowest or alternatively the highest possible position. A typical process relevant travel of the pedestal over the whole target live may be in the range of 40 mm to 90 mm for thick targets, for usual 6 mm targets the travel will be from about 15 mm to 40 mm, therefor a travel of 15 mm to 90 mm would be sufficient for any needs. All types of labyrinths 26 comprise at least one annular pump channel 27.

It is important that during the travel a characteristic distance ($w_{ch}$), e.g. a characteristic width of the channel within the labyrinth, which defines the smallest flow area does not change and stays constant. To exemplify the situation at hand of a simple flow labyrinth between a sputter compartment 18 and a pump compartment 17, in FIG. 5 some distances I, II, III, IV, which may become a characteristic distance during a certain travel distance of the pedestal are shown. In the present example the pedestal has an overall stroke of 95 mm and is designed for a process relevant travel of 40 mm (from 65 to 95 mm, the highest possible position of the pedestal). Under constant vacuum and pumping conditions defined by a 110 cm$^2$ traverse section between dark space shield 8 and inner circumference $r_{ai}$ of the lowest part of the anode shield 2, see diagram in FIG. 6. Within this range distance I defines a constant characteristic distance $w_{ch}$ for the labyrinth and enables to move the wafer towards and away from the target surface to compensate for target erosion and/or to control layer stress in the respective layer stack of the coating. If it comes to lower travel values, distance II becomes the characteristic value of the flow labyrinth 26 as shown by the thick broken line of the characteristic graph V. Within this lower range however the flow area diminishes constantly as distance II becomes smaller when the pedestals fin comes near to the plane of the lower inner circumference of the anode (dashed line). At the end of the lower part of the travel (not shown in the diagram) distance Ill becomes the characteristic value before the pedestal comes to sit at the anode at zero mm travel. With FIG. 2 to 5 gas inlet 13 is integrated within the anode 2 instead between tha anode 2 and the target ring 3. However a similar construction could be also used with FIG. 2 to 5 or vice versa an anode integrated gas inlet with the embodiment of FIG. 1. The dashed horizontal line in FIG. 5 shows an alternative higher position of the upper surface of the ring shield 7, which can have some benefits with certain process parameters and can be again combined with any embodiment of the actual invention. Thereby the upper surface of the ring shield can be in plane with the chuck 6 or the substrate surface or anywhere between.

Similar considerations can be made with the labyrinths 26 as shown with FIGS. 3 and 4, which both comprise one, respectively two 180° turns within the flow channel and therefor very effectively prevent any plasma spill out from the sputter compartment to the pump compartment as long as slit width(s) at the entrance of the labyrinth comply to dark space distance needs according to the respective vacuum conditions or are covered with respectively dimensioned grids. With FIG. 3 the dark space shield 8 is formed trough-like with a channel shield 9 positioned in the center of the trough, together defining a U-like flow channel. With FIG. 4 the channels are integrated in the channel shield 9, which here forms a part of the anode 2. They are positioned between the anode radius $r_a$ within the sputter compartment and the lower anode radius $r_{ai}$ which in this case is at dark space distance to the dark space shield 8. The integration of parts of or the complete labyrinth 26 within the anode shield 2, e.g. as a one-piece device or at least as a close thermic coupling, has merits with reference to a more equal temperature distribution within the sputter compartment. With FIG. 4 a channel coming from the sputter compartment 18 is split sideways into two S-bends leaving into the pumping compartment 17. In this case characteristic distance $w_{ch}$, $=w_{ch1}+w_{ch2}$, whereby $w_{ch1,2}$ can be defined as the widths of respective sub-channels with curved flow arrows.

For a 30 liters volume of the sputter compartment as used with all types of labyrinths, a pumping speed of 500 to 700 l/s should be adjustable. This translates to a pumping speed of about 2000 l/s for the high vacuum pump system 16, e.g. comprising a turbo molecular pump, as connected to the pump socket 44 of the pumping compartment 17, due to the flow resistance of the respective labyrinth 26 as used.

FIG. 7 shows details of an inventive pedestal 5 provided with two inlets 16 for an inert heating/cooling gas, namely one back gas inlet 30 for the wafer when fixed to the ESC and one back gas inlet 31 for the ESC. Respective inlet channels 14 connect the gas inlets with feedthroughs 32 at the bottom of the pedestals base 5'. Such a configuration has some merits compared to a configuration with one inlet for both systems only, as back pressure for the ESC thereby can be risen to higher values whereas the backpressure for the wafer is highly limited, e.g. to a maximum of 5 sccm for a 200 mm wafer to avoid arcing which would occur with higher flows as only the wafer 4 separates the inlet 30 and channels 29 from the high vacuum of the sputter compartment. With such a configuration the ESC 6 can have a surface patterned by channels 29 open to the wafer to rise the flow resistance of the heating/cooling gas when flowing under the wafer from inlet 31 towards an outer region of the ESC 6, where it may escape into the high vacuum of the sputter compartment, see upper horizontal arrows. The surface pattern may be any type of labyrinth pattern, like a cobweb, a spiral, a meandering or mensa-like pattern of open channels 29, with very low aisle height of some μm or even lower to hold flow resistance high. Thereby an equal gas distribution at the backside of the wafer as well as an equal distribution of support points or areas for the wafer support can be achieved to avoid any mechanical stress due to electrostatic force of the ESC 6. Due to the combination of a high support area and the evenly spread shallow channel cavities providing short path ways for the gas molecules between the cool/hot ESC-surface wafer, eventually, e.g. for wafer sizes≥200 mm, combined with severally inlets 30 at different points of the ESC surface, cooling and heating of the backside of the wafer can be performed most efficiently even with low back-gas flow and pressure.

The inlet channel 14 from the feedthrough 32 to the back-gas inlet 31 to cool/heat the lower side of the ESC ends in an open channel 28 which is here realized as back-gas chamber 28 between the pedestal and the ESC. From there, back-gas can flow off to the pumping compartment 17 via needle channels 48 and base channels 49, as symbolized by curved arrows and lower horizontal arrows, both providing a high flow resistance to enable a higher backpressure between pedestal 5 and ESC 6, which can be about from 0.1 to 1 hPa ($10^{-1}$-$10^0$ mbar). Heating of the chuck 5, made of an isolating ceramic material and comprising at least one RF-electrodes 47 is provided by a heater plate 46 on the base 5' of the chuck. Alternatively or additionally a water-cooled chuck can be used.

A multichamber system MCS 50 comprising four process modules $P_1$ to $P_4$ and up to six pre- or post-processing modules $pp_{12}$ to $pp_{46}$, the latter pairwise positioned above and below a wafer handling level are shown in FIG. 8. All modules are arranged circular or polygonal round a central handler compartment 51 comprising a freely programmable handler 52 to transfer wafers from a pre-processing module to processing modules, transfer wafers between modules, and finally transfer back the wafer to a post-processing tool. Transfer in and out of the MCS is done by a loadlock 53 for incoming wafers and a loadlock 54 for outgoing wafers. At least one further handler transfers wafers from the loadlock chamber(s) 55, here realized as one load lock section, to preprocessing module $pp_{12}$ and back again to the loadlock section from postprocessing module $pp_{56}$. Pre- and postprocessing modules $pp_{12}$, $pp_{34}$, $pp_{56}$ may comprise at least one of a buffer for wafers waiting to be processed or transferred, a heating station, a cooling station, and an aligner station. Process modules as present show a minimal configuration when annealing should be performed within the MCS. Therefor module P1 comprises a PVE-station, P2 a metal sputter station and P3 an annealing chamber comprising a flat carbon heater face to face to the substrate surface to be heated. The top and the bottom of the annealing compartment comprising cooled reflector surfaces whereby the substrate is hold near its outer circumference by a three fingers support. Finally, module P4 comprises an inventive compound sputtering apparatus 10 as described above. Further modules, e.g. a second compound sputter module to speed up overall process time by dividing in halves the sputter time for the thickest layer system of the coating, or a second metal sputter module for a layer system comprising two or more metal electrodes, can be connected via docks 56.

A system control unit 36 of the MCS, which may include the respective system units of the modules or a least control the timing of such units, controls wafer transfer as well as process details within every module by control means 38, adjusting means 37, measurement means 40, and sensors (not shown) which again may be included at least in part within the system control unit 36 or separate with respective modules to be controlled. An Input/Output unit 39 allows an operator to modify single process parameters and to load new processes automatically.

In FIG. 9 a MCS 50' with a linear module arrangement is shown schematically. In this case for every process step a separate module is provided between a loadlock 53 for incoming wafers and a load-lock 54 for outgoing wafers with respectively dedicated load-lock chambers 55' and 55" which may comprise pre- and postprocessing modules or be connected to such modules also (see FIG. 8). When the substrate has been transferred from load-lock chamber 55' to PVE-module 1', the process starts with an etching of the clean blank wafer surface, followed by a sputter process in module P4' to deposit a thin compound layer as a seed layer to which a first metal layer Me1 is applied in module P2. It follows the annealing step in module P3, a further PVE step in P1 to refine the metallic surface, a further compound sputter step to apply the functional piezoelectric layer Comp1 to the etched metal layer Me1 in module P4 and finally a second deposition of a second metal layer Me2 to complete the layer stack with a second electrode in module P2', before the substrate is be locked out from vacuum via load lock 54. Wafer transfer between modules and between modules and load-lock chambers 55', 55" is performed by a linear handler 52'.

REFERENCE NUMBERS

1 target, sputtered electrode
2 anode
3 floating target ring
4 wafer
5 RF pedestal
5' base of the pedestal
6 electrostatic chuck (ESC)
7 ring-shield
8 darkspace shield
9 channel shield
10 sputtering apparatus
11 vacuum chamber
12 side wall(s)
13 inlet process gas
14 inlet channel inert heating/cooling gas
15 substrate handling opening
16 vacuum pump system
17 pump compartment
18 sputter compartment
19 top of the sputter compartment
20 bottom of the sputter compartment
21 first voltage source
22 magnetron sputter source
23 magnet-system
24 backplate
25 second voltage source
26 flow labyrinth
27 annular pump channel
28 open channel pedestal/ESC
29 open channel ESC/wafer
30 back gas inlet wafer
31 back gas inlet ESC
32 feedthrough
33 gas ring, inlet process gas
34 channel structure
35 inlet gap
36 central processing unit
37 adjusting means
38 control means
39 I/O-device
40 temperature measurement device
41 RF-line
42 heating and cooling line
43 isolator
44 pump socket
45 pedestals fin
46 heater plate
47 RF-electrode
48 needle channelcool/heat
49 base channelchuck heater
50 multichamber system (MSC)
51 handler compartment
52 handler
53 load-lock in
54 load-lock out
55 load-lock section
56 dock
$Me_m$ minor metal
Me (preferably minor) metals in a concentration of 0.1 to 10 atomic percent
$P_1 \ldots P_4$ process modules
$pp_{12} \ldots pp_{56}$ pre- or post-processing modules
$r_t$ target radius
$r_a$ anode radius
$r_{al}$ lower anode radius
$w_{ch}$ width of pump channel

What is claimed is:

1. A vacuum apparatus to deposit a compound layer on at least one plate shaped substrate by sputtering comprising:
    a vacuum chamber with a central axis (A), the chamber including
        at least one inlet for a process gas;
        1 at least one inlet for an inert gas;
        a substrate handling opening;
        a pedestal comprising an electrostatic chuck formed as a substrate support positioned in a central lower area of a sputter compartment, the pedestal being mounted in an electrically isolated manner and connected to a first pole of a first voltage source, the pedestal further being movable in a vertical direction towards and away from a target from an upper position to a lower position and vice-versa when a sputter process is active;
        a magnetron sputter source comprising the target at a frontside and a magnet-system at a backside of the magnetron sputter source, the target being mounted in a central area at a top of the sputter compartment of the chamber in an electrically isolated manner and being connected to a first pole of a second voltage source;
        an anode looping around the target and at least an upper part of the pedestal which comprises the substrate support and the electrostatic chuck thereby forming sidewalls of the sputter compartment, the anode being electrically connected to ground; and
        a pump compartment being connected to a bottom of the sputter compartment by a flow labyrinth configured for conductance of gases therethrough in the upper and lower position of the pedestal, the flow labyrinth being designed to provide essentially the same flow conductance of the gases in the upper and lower position of the pedestal and in any position in between, wherein at least one characteristic distance ($w_{ch}$) between at least two cylindrically or/and ring-shaped surrounding walls of at least one annular pump channel of the flow labyrinth is constant in the upper and lower position of the pedestal and in any position in between,
    a vacuum pump system connected to the pump compartment;
        a dark space shield connected to ground and positioned in dark space distance looping at least around a base of the pedestal, the dark space shield forming one sidewall of the at least one annular pump channel and being movable with the pedestal; and
        a second channel shield forming, with reference to the central axis (A), an outer sidewall to define the at least one annular pump channel, the second channel shield being mounted to and movable with the dark space shield.

2. The apparatus according to claim 1, wherein the flow labyrinth is designed to have the same flow area during a movement from the upper to the lower position of the pedestal and in any position in between.

3. The apparatus according to claim 1, wherein the at least one annular pump channel loops around the pedestal in an area below the substrate support and the electrostatic chuck.

4. The apparatus according to claim 1, wherein an electrically isolated target ring is mounted looping around a circumference of the target between the target and the anode.

5. The apparatus according to claim 4, wherein the electrically isolated target ring is made of a conductive material and is isolated from ground and target potential by at least one ceramic ring which is hidden from any line of sight towards the sputter compartment.

6. The apparatus according to claim 1, wherein a ring-shield is mounted electrically isolated onto the pedestal surrounding the substrate support and a mounted substrate.

7. The apparatus according to claim 6, wherein the ring-shield is connected to a third voltage source.

8. The apparatus according to claim 1, wherein at least one of a surface of the pedestal and a surface of the electrostatic chuck comprise an open channel connected to a respective back-gas inlet.

9. The apparatus according to claim 8, wherein both surfaces comprise an open channel with a back-gas inlet.

10. The apparatus according to claim 9, wherein both back-gas inlets are connected to one common or respective separate feedthroughs to a common or respective separate gas supplies.

11. The apparatus according to claim 1, wherein the anode is manufactured as a single piece anode.

12. The apparatus according to claim 1, wherein gas supply means for the process gas, the inert gas or a mixture thereof is mounted along or around an upper or a lower circumference of the anode.

13. The apparatus according to claim 12, wherein the gas supply means comprise at least one of a gas ring with distribution openings allocated along a circumference of the gas ring and a channel structure integrated in the anode with a circular distribution gap or respectively allocated distribution openings and/or or further distribution channels.

14. The apparatus according to claim 1, wherein the first voltage source is a first RF power supply.

15. The apparatus according to claim 1, wherein the second voltage source is a pulsed DC power supply, or a DC power supply and a second RF power supply whereby at least the DC power supply is connected by an adapter network to a sputter electrode of the magnetron sputter source.

16. The apparatus according to claim 15, wherein the first voltage source is a first RF power supply, the second voltage source is a DC power supply and a second RF power supply, and the apparatus comprises adjusting means to adjust a phase relation between the first RF power supply and the second RF power supply.

17. The apparatus according to claim 1, wherein the apparatus comprises control means to control a flow of the process gas in dependency of at least one of the following process parameters: a target voltage, an intensity or a line pattern of a plasma emission measured at an active sputtering surface of the target, a gas composition.

18. The apparatus according to claim 1, wherein the target consists of at least one of the following materials or a mixture thereof:
aluminium (Al or AlMe),
aluminium-scandium (AlSc or AlScMe),
aluminium-chromium (AlCr or AlCrMe),
magnesium-hafnium (AlMgHf or AlMgHfMe),
whereas Me stands for at least one further metal in a concentration of 0.1 to 10 atomic percent with reference to an overall metal content of a respective layer and a mixture of two or three main metals as AlSc, AlCr or AlMgHf always comprises at least 1% of a main metal which is in lower concentration.

19. Multi-chamber vacuum system (MCS) to process at least one plate shaped substrate, comprising at least one load-lock chamber, transfer means, and at least three processing modules, whereby a first processing module is a physical vapor etching module (P1) configured to etch a surface of a substrate, a second processing module is a metal sputter module (P2) configured to deposit a metal layer by sputtering to the surface of the substrate, and a third processing module is a compound sputter module (P4) configured according to the apparatus of claim 1.

20. The MCS according to claim 19, comprising a fourth process module that is an annealing module (P3) configured to heat a substrate to an annealing temperature $T_A$ between 550° C. and 900° C.

21. The MCS according to claim 5, wherein the annealing module is configured to heat the substrate within 60 to 180 s to the annealing temperature $T_A$.

22. The MCS according to claim 19, wherein the MCS comprises at least one further module of at least one of a physical vapor etching module (P1'), a metal sputter module (P2'), and a compound sputter module (P4').

23. Method to produce a piezoelectric coating on at least one side of at least one plate shaped substrate, the method comprising a sputter process carried out in the apparatus of claim 1.

24. The method according to claim 23, wherein a piezoelectric AlN film or a respective AlN film comprising at least one minor metal $Me_m$ and/or Scandium is deposited, whereby a hexagonal structure of AlN is preserved.

25. The method according to claim 23, wherein the piezoelectric coating comprises
or consists of at least one of the following materials or a mixture thereof:
aluminium nitride (AlN, AlMeN),
aluminium-scandium nitride (AlScN, AlScMeN),
aluminium-chromium nitride (AlCrN) or
magnesium-hafnium nitride (MgHfN, MgHfMeN),
whereas Me stands for at least one further metal in a concentration of 0.1 to 10 atomic percent with reference to an overall metal content of the piezoelectric coating.

26. Method to produce a piezoelectric coating on at least one side of at least one plate shaped substrate, the method comprising a sputter process carried out in the MCS of claim 19.

* * * * *